United States Patent
Kuo

(10) Patent No.: US 8,329,594 B2
(45) Date of Patent: Dec. 11, 2012

(54) METHOD FOR FABRICATING A SEMICONDUCTOR STRUCTURE

(75) Inventor: Lung-En Kuo, Tainan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 198 days.

(21) Appl. No.: 12/851,550

(22) Filed: Aug. 5, 2010

(65) Prior Publication Data

US 2012/0034781 A1  Feb. 9, 2012

(51) Int. Cl.
*H01L 21/302* (2006.01)
(52) U.S. Cl. ......... 438/736; 438/714; 438/725; 430/313
(58) Field of Classification Search .......... 438/706, 438/712, 714, 725, 736, 742, 737; 430/313, 430/316, 314
See application file for complete search history.

(56) References Cited

U.S. PATENT DOCUMENTS

| 6,096,659 | A | 8/2000 | Gardner |
| 6,121,155 | A | 9/2000 | Yang |
| 7,306,746 | B2 | 12/2007 | Chen |
| 7,592,265 | B2 | 9/2009 | Wang |
| 2004/0038139 | A1* | 2/2004 | Mui et al. ......... 430/30 |
| 2007/0161255 | A1* | 7/2007 | Pau et al. ......... 438/778 |
| 2007/0202445 | A1* | 8/2007 | Morioka ......... 430/313 |
| 2007/0281491 | A1* | 12/2007 | Kamp ......... 438/717 |

* cited by examiner

*Primary Examiner* — Lan Vinh
(74) *Attorney, Agent, or Firm* — Winston Hsu; Scott Margo

(57) ABSTRACT

A method for fabricating a semiconductor structure is disclosed. The method includes the steps of: providing a substrate; depositing a material layer on the substrate; forming at least one dielectric layer on the material layer; forming a patterned resist on the dielectric layer; performing a first trimming process on at least the patterned resist; performing a second trimming process on at least the dielectric layer; and using the dielectric layer as mask for etching the material layer.

20 Claims, 4 Drawing Sheets

METHOD FOR FABRICATING A SEMICONDUCTOR STRUCTURE

BACKGROUND OF THE INVENTION

1. Field of the Invention

The invention relates to a method for fabricating a semiconductor structure, and more particularly, to a method of trimming hard mask for forming a gate electrode layer of a MOS structure.

2. Description of the Prior Art

During the process of manufacturing metal oxide semiconductor transistors (MOS transistors), the formation of a conductive gate plays an important role. In order to meet the demand of miniaturization of the semiconductor industry, the current channel length under the gate must meet the standard of less than 35 nm. To meet the less than 35 nm channel length requirement, it is crucial to control the critical dimension (CD) during the process of exposure of the gate so as to control the line width of the conductive layer (poly-Si layer for example) after the etching process. Because the current lithographic tool techniques are incapable of obtaining the ideal CD, trimming methods are employed in some prior art methods to reduce the size of gate line width. However, most photo resist layers useful in the current gate exposure process are 193 nm photo resist layers which are intrinsically less resistant to the etching condition than 365 nm photo resist layers are on account of acrylic and cycloalkenyl polymer composition in contrast to 365 nm photo resist layers composed of aryl moiety. Furthermore, the thickness of 193 nm photo resist layers reduces as the exposure wavelength shortens. Under the dual disadvantages of poor etching resistance and less and less thickness, it is hard for 193 nm photo resist layers to meet the minimum requirement of 30 nm owing to the available thickness being 10 nm or less during the trimming process on 193 nm photo resist layers.

In order to overcome the problem, the current techniques deals with the problems by transferring the pattern on the photo resist layer to the hard mask beneath the photo resist layer. After being patterned, the hard mask is ready for the trimming process to reduce the gate line width. In addition, the hard mask must have high etching selectivity to the conductive layer used in forming gate layer. Accordingly, the trimmed hard mask is ready to be the template for etching transfer process to define the line width of gate layer.

However, as only one trimming process is typically employed on the photo resist layer and the hard mask above the designated gate layer, issues such as line twisting or line less often occur on the hard mask beneath the photo resist layer and result in a flawed gate structure. Moreover, the hard mask is also prone to line collapse during the trimming procedure and the following etching on conductive layer, which would destroy the entire process or the results. Accordingly, it is important to develop a better method for trimming hard masks to form the gate of MOS transistors with ideal gate length.

SUMMARY OF THE INVENTION

It is an objective of the present invention to provide a method of trimming hard masks for fabricating a gate layer of a MOS device.

According to a preferred embodiment of the present invention, a method for fabricating a semiconductor structure is disclosed. The method includes the steps of: providing a substrate; depositing a material layer on the substrate; forming at least one dielectric layer on the material layer; forming a patterned resist on the dielectric layer; performing a first trimming process on at least the patterned resist; performing a second trimming process on at least the dielectric layer; and using the dielectric layer as mask for etching the material layer.

Another aspect of the present invention discloses a method for fabricating a semiconductor structure, which includes the steps of: providing a substrate; depositing a material layer on the substrate; forming at least one dielectric layer on the material layer; forming a patterned resist on the dielectric layer; performing a first trimming process on at least the patterned resist; performing a second trimming process on at least the dielectric layer after exposing the material layer.

Another aspect of the present invention discloses a method for fabricating a semiconductor structure, which includes the steps of: providing a substrate; depositing a material layer on the substrate; forming a plurality of trimming layers on the material layer; and performing at least a two-step trimming process on the trimming layers such that the trimming layers are trimmed twice.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
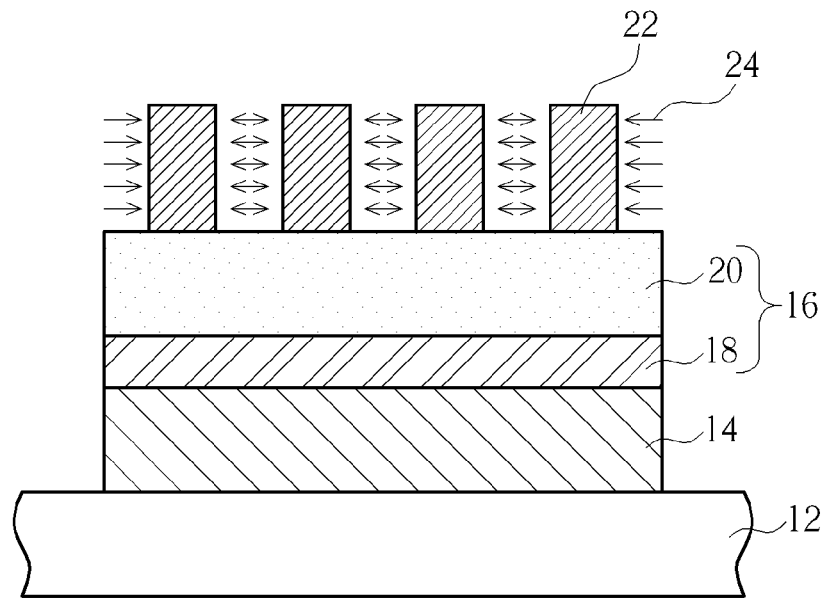
FIGS. 1-4 illustrate a method for fabricating a semiconductor structure according to a preferred embodiment of the present invention.

Referring to FIGS. 1-4, FIGS. 1-4 illustrate a method for fabricating a semiconductor structure according to a preferred embodiment of the present invention. As shown in FIG. 1, a substrate 12, such as a silicon substrate is provided. Next, a gate dielectric layer (not shown) preferably composed of oxide, oxy-nitride, nitrogen-containing dielectric materials or a combination thereof may be formed on the substrate by thermal oxidation, chemical vapor deposition (CVD), or plasma enhanced chemical vapor deposition (PECVD). A material layer, such as a silicon layer or a polysilicon layer 14 is then deposited on the gate dielectric layer and at least a dielectric layer 16 is formed on the polysilicon layer 14 thereafter.

The at least one dielectric layer 16 may be composed of one single dielectric layer or a plurality of dielectric layers. In this embodiment, a plurality of dielectric layers are deposited on the polysilicon layer 14, in which the dielectric layers include a hard mask 18 and a bottom anti-reflective coating (BARC) 20. In this embodiment, the hard mask 18 could be selected from a material consisting of SiON, $SiO_2$, TEOS, or a combination thereof, and the BARC 20 may be formed from an organic polymer anti-reflective coating material, such as a 365 nm (I-line) resist layer. A patterned resist 22 is formed on the BARC 20 thereafter.

After the patterned resist 22 is formed, a trimming process 24 could be conducted to narrow the width of the patterned resist 22. The trimming process 24 may be accomplished by a plasma etch using gases such as oxygen, ozone, $CF_4$, $CHF_3$ or $HBr/O_2$, and if the target layer to be trimmed were resist material, ashing may be used.

Figure 2:
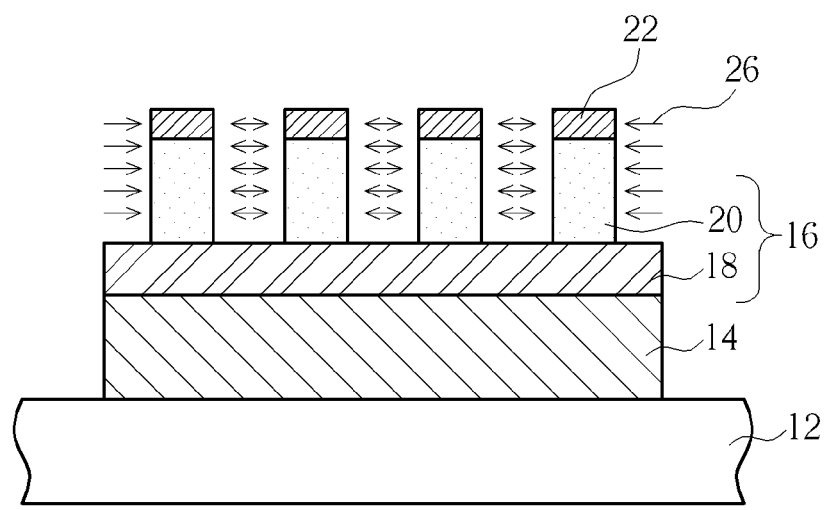

As shown in FIG. 2, after trimming the patterned resist 22, an etching process is carried out by using the patterned resist as mask to remove a portion of the BARC 20 underneath. After the pattern of the patterned resist 22 is transferred to the BARC 20, another trimming process 26 is conducted to narrow the width of the patterned resist 22 and the BARC 20. The etching gas used in this trimming process 26 preferably trims only the target layers such as the aforementioned patterned resist 22 and BARC 20 without affecting any other layer underneath, and could be identical or different from the etching gas used in the previous trimming step 24.

Figure 3:
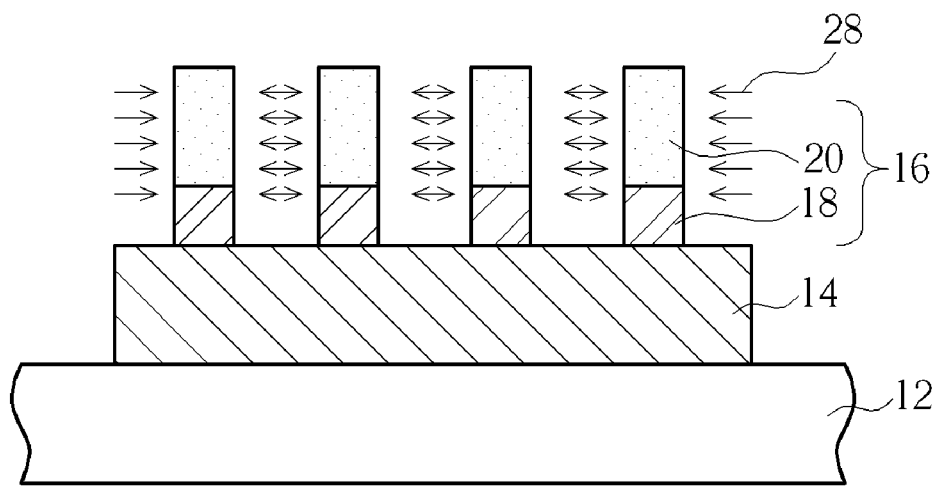

As shown in FIG. 3, after the patterned resist 22 and the BARC 20 are trimmed, an etching is performed by using the patterned resist 22 and the BARC 20 as mask to remove a portion of the hard mask 18 underneath. As the etching is carried out on the hard mask 18, a portion of the polysilicon layer 14 surface is exposed and the patterned resist 22 may be etched away as the pattern of the BARC 20 is transferred to the hard mask 18. Next, another trimming process 28 could be conducted to narrow the width of the BARC 20 and the hard mask 18. The etching gas used in this trimming process 28 could be identical or different from the etching gas used in the previous trimming steps 24 or 26.

Preferably, as a substantial amount of polysilicon layer 14 is lost due to the etching gas used during the trimming procedure, a fixed time were to be calculated for the trimming process 28 after exposing the polysilicon layer 14 to control the width difference between the top of the polysilicon layer 14 and the bottom of the polysilicon layer 14 no more than 10%. According to a preferred embodiment of the present invention, the fixed time of the trimming procedure is calculated after trimming greater than 70% of a total trimming value.

For instance, if a width of the BARC 20 and the hard mask 18 were to be reduced from 60 nm to 40 nm after the surface of the polysilicon layer 14 is exposed, 6 nm from the total of 20 nm being etched away in the trimming procedure would be reserved for the polysilicon layer 14. As the trimming procedure starts, a fixed time of 30 seconds is calculated to trim the 6 nm for the polysilicon layer 14.

It should be noted that even though three trimming processes 24, 26, 28 are disclosed in this embodiment, operators could choose to perform only two or all three of these trimming process 24, 26, 28 through the fabrication.

For instance, if only the trimming processes 26 and 28 were selected to be performed throughout the fabrication, operators could omit the trimming process 24 by using the untrimmed patterned resist 22 directly as mask to pattern the BARC 20 and perform the subsequent trimming processes 26 and 28 as mentioned previously.

Moreover, despite the aforementioned embodiment strips the patterned resist 22 after the trimming process 26 by either a separate etching process or along with the patterning of the hard mask 18, the patterned resist 22 could also be remained on the BARC 20 and the hard mask 18 until exposing the surface of the polysilicon layer 14. In other words, after trimming the patterned resist 22, one ore more etching process could be carried by using the patterned resist 22 as mask to pattern the BARC 20 and hard mask 18 until exposing the surface of the polysilicon layer 14. After the polysilicon layer 14 is exposed, another trimming process is conducted to trim the patterned resist 22, the patterned BARC 20, and the patterned hard mask 18 before patterning the polysilicon layer 14. This approach of performing at least two trimming process that all involves the trimming of patterned resist is also within the scope of the present invention.

Figure 4:
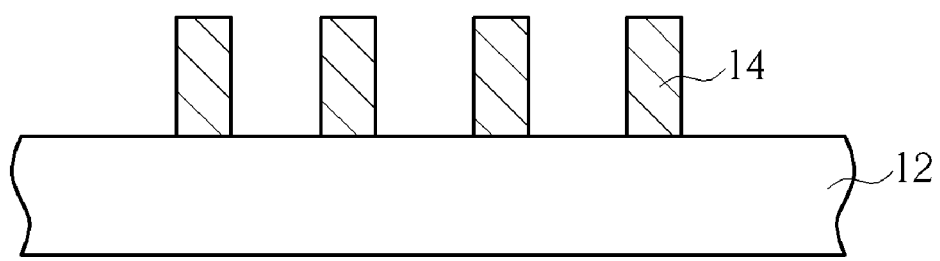

As shown in FIG. 4, after the patterned BARC 20 and the hard mask 18 are trimmed, an etching is performed by using the patterned BARC 20 and the hard mask 18 as mask to remove a portion of the polysilicon layer 14 underneath for forming a patterned polysilicon layer 14. The patterned polysilicon layer 14 is preferably used as a gate electrode of a metal-oxide semiconductor (MOS) device, and after the patterned polysilicon 14 is formed, typical MOS fabrication involving the formation of offset spacer, lightly doped drain, main spacer, source/drain region, epitaxial layers, stress layers, salicides, and contact plugs could be employed to form a MOS structure. As the fabrication of these MOS structure elements are commonly known to those skilled in the art in this field, the details of which are omitted herein for the sake of brevity.

In another embodiment of the present invention, the material layer can include other suitable materials, such as silicon, silicon oxide or metal. Therefore, the patterned material layer fabricated by above mentioned steps can be used as other semiconductor structure, such as STI or contact plug.

Figure 5:
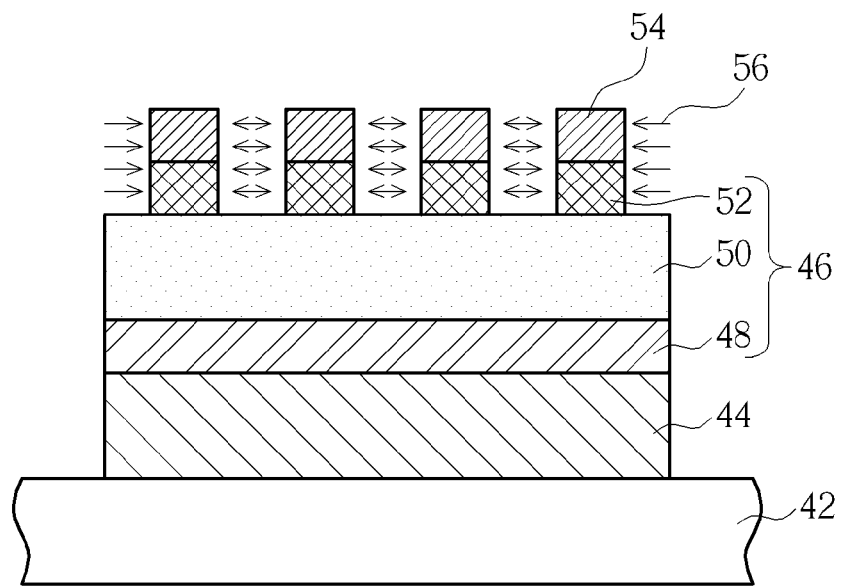
FIGS. 5-8 illustrate a method for fabricating a semiconductor structure according to an embodiment of the present invention.

Referring to FIGS. 5-8, FIGS. 5-8 illustrate a method for fabricating a semiconductor structure according to an embodiment of the present invention. As shown in FIG. 5, a substrate 42, such as a silicon substrate is provided. Next, a gate dielectric layer (not shown) preferably composed of oxide, oxy-nitride, nitrogen-containing dielectric materials or a combination thereof may be formed on the substrate by thermal oxidation, chemical vapor deposition (CVD), or plasma enhanced chemical vapor deposition (PECVD). A polysilicon layer 44 is then deposited on the gate dielectric layer and at least a dielectric layer 46 is formed on the polysilicon layer 44 thereafter.

The at least one dielectric layer 46 may be composed of one single dielectric layer or a plurality of dielectric layers. In this embodiment, a plurality of dielectric layers are deposited on the polysilicon layer 44, in which the dielectric layers include a hard mask 48, an advanced patterning film (APF) 50 from Applied Materials, Inc., and a dielectric anti-reflective coating (DARC) 52. In this embodiment, the hard mask 48 could be selected from a material consisting of SiON, $SiO_2$, TEOS, or a combination thereof, and the DARC 52 may be formed from an organic polymer anti-reflective coating material, such as a silicon-rich silicon oxynitride layer. A patterned resist 54 is formed on the DARC thereafter.

An etching is then carried out by using the patterned resist 54 as mask to remove a portion of the DARC 52 underneath for forming a patterned DARC 52. Despite the patterned resist 54 is used directly as an etching mask for patterning the DARC 52 underneath, a trimming process could be conducted before the DARC 52 is etched. After the DARC 52 is patterned, a trimming process is conducted to narrow the width of the patterned resist 54 and the patterned DARC 52. The trimming process 56 may be accomplished by a plasma etch using gases such as oxygen, ozone, $CF_4$, $CHF_3$ or $HBr/O_2$, and if the target layer to be trimmed were resist material, ashing may be used.

Figure 6:
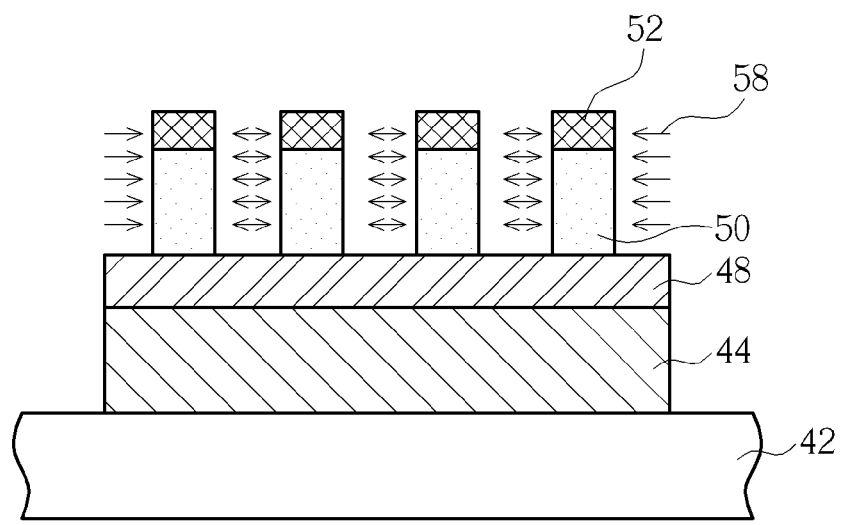

As shown in FIG. 6, after trimming the patterned resist 54 and the DARC 52, an etching process is carried out by using the patterned resist 54 and DARC 52 as mask to remove a portion of the APF 50 underneath. Depending on the etchant used for removing the APF 50, the patterned resist 54 could be removed as the APF 50 is patterned, or could be removed by a separate etching step prior to the patterning of the APF 50, which is also within the scope of the present invention. After the pattern of the DARC 52 is transferred to the APF 50, another trimming process 58 is conducted to narrow the width of the DARC 52 and the APF 50. The etching gas used in this trimming process 58 could be identical or different from the etching gas used in the previous trimming step 56.

Figure 7:
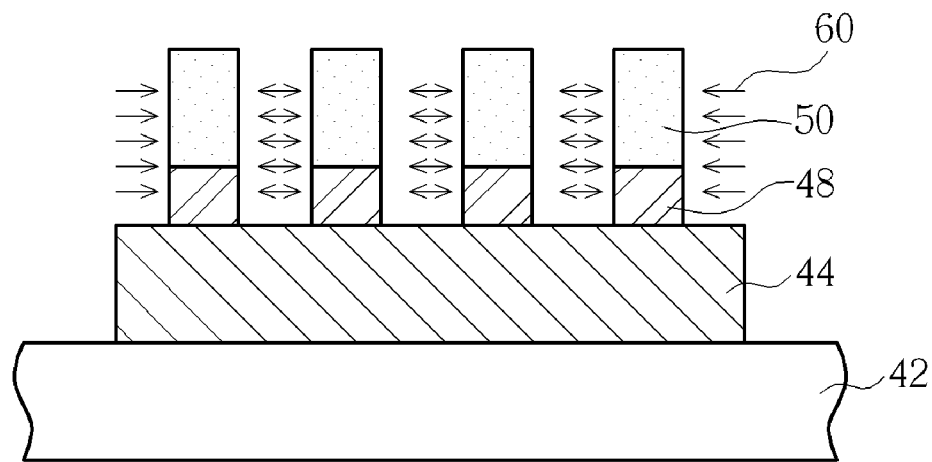

As shown in FIG. 7, after trimming the patterned DARC 52 and the APF 50, an etching process is carried out by using the trimmed DARC 52 and APF 50 as mask to remove a portion of the hard mask 48 underneath. Depending on the etchant used for removing the hard mask 48, the DARC 52 could be removed as the hard mask 48 is patterned, or could be removed by a separate etching step prior to the patterning of the hard mask 48, which is also within the scope of the present invention. After the pattern of the APF 50 is transferred to the hard mask 48, another trimming process 60 is conducted to narrow the width of the APF 50 and the hard mask 48. The etching gas used in this trimming process 60 could be identical or different from the etching gas used in the previous trimming steps 56 or 58.

Similar to the aforementioned embodiment, even though three trimming processes 56, 58, 60 are disclosed in this embodiment, operators could choose to perform only two or all three of these trimming process 56, 58, 60 throughout the fabrication.

For instance, if only the trimming processes 58 and 60 were selected to be performed throughout the fabrication, operators could omit the trimming process 24 by using the untrimmed patterned resist 54 and DARC 52 directly as mask to pattern the APF 50 and perform the subsequent trimming processes 58 and 60 as mentioned previously.

Moreover, despite the aforementioned embodiment strips the patterned resist 54 after the trimming process 56 by either a separate etching process or along with the patterning of the APF 50, the patterned resist 54 could also be remained on the DARC 52 until exposing the surface of the polysilicon layer 44. In other words, after trimming the patterned resist 54 and the DARC 52, one ore more etching process could be carried by using the patterned resist 54 and DARC 52 as mask to pattern the APF 50 and hard mask 48 until exposing the surface of the polysilicon layer 44. After the polysilicon layer 44 is exposed, another trimming process is conducted to trim the patterned resist 54, the patterned DARC 52, patterned APF 50, and the patterned hard mask 48 before transferring the pattern to the polysilicon layer 44. This approach of performing at least two trimming process that all involves the trimming of patterned resist is also within the scope of the present invention.

Figure 8:
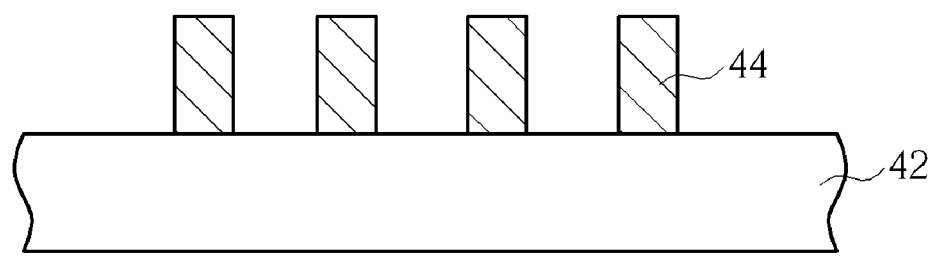

As shown in FIG. 8, after the patterned APF 50 and the hard mask 48 are trimmed, an etching is performed by using the patterned APF 50 and the hard mask 48 as mask to remove a portion of the polysilicon layer 44 underneath. The patterned APF 50 and the hard mask 48 could be removed by another etching thereafter.

The patterned polysilicon layer 44 is preferably used as a gate electrode of a metal-oxide semiconductor (MOS) device, and after the patterned polysilicon 44 is formed, typical MOS fabrication involving the formation of offset spacer, lightly doped drain, main spacer, source/drain region, epitaxial layers, salicides, and contact plugs could be employed to form a MOS structure. As the fabrication of these MOS structure elements are commonly known to those skilled in the art in this field, the details of which are omitted herein for the sake of brevity.

Overall, the present invention conducts at least two trimming process through the fabrication of a semiconductor structure, such as a polysilicon gate of a MOS device. By applying two or more trimming process on the patterned resist and dielectric layers above the designated polysilicon layer, issued such as line lost or line collapse during the trimming procedure of gate layer formation could be improved substantially.

Those skilled in the art will readily observe that numerous modifications and alterations of the device and method may be made while retaining the teachings of the invention.

What is claimed is:

1. A method for fabricating a semiconductor structure, comprising the steps of:
    providing a substrate;
    depositing a material layer on the substrate;
    forming at least one dielectric layer on the material layer, wherein the at least one dielectric layer comprises a bottom anti-reflective coating (BARC) and a hard mask;
    forming a patterned resist on the dielectric layer;
    performing a first trimming process on the patterned resist;
    using the patterned resist for etching the BARC;
    performing a second trimming process on the patterned resist and the BARC;
    using the patterned resist and the BARC to etch the hard mask for exposing the material layer;
    performing a third trimming process on the BARC and the hard mask; and
    using the BARC and the hard mask for etching the material layer.

2. The method of claim 1, wherein the material layer comprises silicon, polysilicon or metal.

3. The method of claim 1, further comprising:
    performing the first trimming process on the patterned resist and the BARC;
    using the patterned resist and the BARC to etch the hard mask for exposing the material layer;
    performing the second trimming process on the BARC and the hard mask; and
    using the BARC and the hard mask for etching the material layer.

4. The method of claim 1, wherein after the material layer is etched, the patterned material layer forms a gate electrode, an STI or a contact plug.

5. The method of claim 1, wherein the at least one dielectric layer comprises a dielectric anti-reflective coating (DARC), an advanced patterning film (APF), and a hard mask.

6. The method of claim 5, further comprising:
    performing the first trimming process on the patterned resist and the DARC;
    using the patterned resist and the DARC for etching the APF;
    performing the second trimming process on the DARC and the APF; and
    using the DARC and the APF to etch the hard mask for exposing the material layer; and
    performing a third trimming process on the APF and the hard mask; and
    using the APF and the hard mask for etching the material layer.

7. The method of claim 5, further comprising:
    performing the first trimming process on the patterned resist and the DARC;
    using the patterned resist and the DARC for etching the APF and the hard mask for exposing the material layer;
    performing the second trimming process on the APF and the hard mask; and
    using the APF and the hard mask for etching the material layer.

8. The method of claim 1, further comprising:
    performing the second trimming process on the patterned resist and the at least one dielectric layer; and using the dielectric layer as mask for etching the material layer.

9. The method of claim 8, wherein the at least one dielectric layer comprises a bottom anti-reflective coating (BARC) and a hard mask.

10. The method of claim 9, further comprising:
performing the first trimming process on the patterned resist;
using the patterned resist for etching the BARC and the hard mask for exposing the material layer;
performing the second trimming process on the patterned resist, the BARC, and the hard mask; and
using the patterned resist, the BARC, and the hard mask for etching the material layer.

11. The method of claim 8, wherein the at least one dielectric layer comprises a dielectric anti-reflective coating (DARC), an advanced patterning film (APF), and a hard mask.

12. The method of claim 11, further comprising:
performing the first trimming process on the patterned resist;
using the patterned resist for etching the DARC, the APF, and the hard mask for exposing the material layer;
performing the second trimming process on the patterned resist, the APF, and the hard mask; and
using the patterned resist, the APF, and the hard mask for etching the material layer.

13. A method for fabricating a semiconductor structure, comprising the steps of:
providing a substrate;
depositing a material layer on the substrate;
forming at least one dielectric layer on the material layer, wherein the at least one dielectric layer comprises a dielectric anti-reflective coating (DARC), an advanced patterning film (APF), and a hard mask;
forming a patterned resist on the dielectric layer;
performing a first trimming process on the patterned resist and the DARC;
using the patterned resist and the DARC for etching the APF;
performing a second trimming process on the DARC and the APF;
using the DARC and the APF to etch the hard mask for exposing the material layer;
performing a third trimming process on the APF and the hard mask; and
using the APF and the hard mask for etching the material layer.

14. The method of claim 13, wherein the material layer comprises silicon, polysilicon layer or metal.

15. The method of claim 13, further comprising calculating the fixed time of the second trimming process after trimming greater than 70% of a total trimming value.

16. The method of claim 13, further comprising:
performing the first trimming process on the patterned resist and the DARC;
using the patterned resist and the DARC for etching the APF and the hard mask for exposing the material layer;
performing the second trimming process on the APF and the hard mask; and
using the APF and the hard mask for etching the material layer.

17. The method of claim 13, wherein the second trimming process is conducted according to a fixed time for controlling the width difference between the top of the material layer and the bottom of the material layer no more than 10%.

18. The method of claim 13, wherein the at least one dielectric layer comprises a bottom anti-reflective coating (BARC) and a hard mask.

19. The method of claim 18, further comprising:
performing the first trimming process on the patterned resist;
using the patterned resist for etching the BARC;
performing the second trimming process on the patterned resist and the BARC;
using the patterned resist and the BARC to etch the hard mask for exposing the material layer;
performing a third trimming process on the BARC and the hard mask; and
using the BARC and the hard mask for etching the material layer.

20. The method of claim 18, further comprising:
performing the first trimming process on the patterned resist and the BARC;
using the patterned resist and the BARC to etch the hard mask for exposing the material layer;
performing the second trimming process on the BARC and the hard mask; and
using the BARC and the hard mask for etching the material layer.

* * * * *